(12) United States Patent
Shiimoto et al.

(10) Patent No.: US 7,583,525 B2
(45) Date of Patent: Sep. 1, 2009

(54) METHOD OF DRIVING STORAGE DEVICE

(75) Inventors: Tsunenori Shiimoto, Kanagawa (JP);
Nobumichi Okazaki, Kanagawa (JP);
Hironobu Mori, Nagasaki (JP);
Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 59 days.

(21) Appl. No.: 11/738,933

(22) Filed: Apr. 23, 2007

(65) Prior Publication Data
US 2007/0247894 A1 Oct. 25, 2007

(30) Foreign Application Priority Data
Apr. 24, 2006 (JP) .......................... P2006-119347

(51) Int. Cl.
*G11C 11/00* (2006.01)
(52) U.S. Cl. .................. 365/148; 365/158; 365/164
(58) Field of Classification Search .............. 365/148, 365/145, 171, 173, 158, 164
See application file for complete search history.

(56) References Cited

U.S. PATENT DOCUMENTS

| | | | | |
|---|---|---|---|---|
| 6,888,773 | B2 * | 5/2005 | Morimoto | 365/218 |
| 7,061,790 | B2 * | 6/2006 | Morimoto et al. | 365/148 |
| 7,145,791 | B2 * | 12/2006 | Tsushima et al. | 365/148 |
| 7,184,295 | B2 * | 2/2007 | Tsushima et al. | 365/148 |
| 7,221,600 | B2 * | 5/2007 | Hara et al. | 365/189.08 |
| 7,236,388 | B2 * | 6/2007 | Hosoi et al. | 365/148 |
| 7,239,539 | B2 * | 7/2007 | Moriyama et al. | 365/158 |
| 7,239,542 | B2 * | 7/2007 | Ootsuka et al. | 365/158 |
| 7,247,357 | B2 * | 7/2007 | Shiba et al. | 428/1.51 |
| 7,286,416 | B2 * | 10/2007 | Ooishi et al. | 365/189.05 |
| 7,433,220 | B2 * | 10/2008 | Shiimoto et al. | 365/145 |
| 2008/0019195 | A1 * | 1/2008 | Ooishi et al. | 365/189.15 |
| 2009/0010039 | A1 * | 1/2009 | Tokiwa et al. | 365/148 |

FOREIGN PATENT DOCUMENTS

| | | |
|---|---|---|
| JP | 2004-241396 | 8/2004 |
| JP | 2005-025914 | 1/2005 |
| JP | 2005-216387 | 8/2005 |
| JP | 2006-032867 | 2/2006 |
| WO | WO2005/031752 | 4/2005 |

OTHER PUBLICATIONS

Nikkei Electronics, Nov. 18, 2002, p. 130.
Japanese Office Action (2006-119347) dated Dec. 9, 2008.

* cited by examiner

*Primary Examiner*—Tuan T Nguyen
*Assistant Examiner*—Hien N Nguyen
(74) *Attorney, Agent, or Firm*—K&L Gates LLP

(57) ABSTRACT

A method of driving a storage device including a variable resistance element in which resistance value is changed reversibly between a high resistance state and a low resistance state by applying voltages with different polarities between two electrodes is provided. The storage device includes a plurality of memory cells formed of the variable resistance elements. The method includes the step of applying voltages more than once in combination to the memory cell when the variable resistance element is changed from the low resistance state to the high resistance state.

9 Claims, 4 Drawing Sheets

METHOD OF DRIVING STORAGE DEVICE

CROSS REFERENCES TO RELATED APPLICATIONS

The present application claims priority to Japanese Patent Application JP 2006-119347 filed in the Japanese Patent Office on Apr. 24, 2006, the entire contents of which being incorporated hereby by reference.

BACKGROUND

The present application relates to a method of driving a storage device (memory) which has memory cells formed of non-volatile variable resistance elements and in which the operation (erase operation) to change a variable resistance element from a low resistance state to a high resistance state is carried out.

Storage devices of related-art, in particular, storage devices using flash memories may not require electric power to retain stored data, and therefore such storage devices have been widely used in recent years.

In particular, flash memories are typically used for memories in portable terminal devices such as mobile phone units.

Nikkei Electronics, Nov. 18, 2002, page 130, for example, discloses storage devices using the flash memories with a problem in which a data write speed is not so high.

SUMMARY

Applicants of the present application have previously proposed a non-volatile variable resistance element which may have characteristics superior to those of the above-mentioned flash memories.

FIG. 1A of the accompanying drawings is a cross-sectional view showing a film arrangement of a variable resistance element 105. As shown in FIG. 1A, for example, the variable resistance element 105 includes a conductive film 103 and an insulating film 104 which are provided between two electrodes 101 and 102. When a voltage is applied to the variable resistance element 105 so that an electric current I may flow from the conductive film 103 to the insulating film 104, the variable resistance element 105 changes to a low resistance state to write data. When on the other hand a voltage is applied to the variable resistance element 105 so that the electric current I may flow from the insulating film 104 to the conductive film 103, the variable resistance element 105 changes to a high resistance state to erase the data.

FIG. 1B shows a circuit symbol of the variable resistance element 105. The direction pointed by an upward arrow in the circuit symbol shown in FIG. 1B corresponds to the upward direction in which the electric current I shown in FIG. 1A is directed.

The variable resistance element 105 having such arrangement can constitute a memory cell with a simplified structure, compared to the flash memory or the like, and therefore, without size dependence and influence of scaling, a strong signal can be obtained.

Also, the variable resistance element 105 has such advantages that a data write speed based on the change of a resistance value can be improved to about 5 ns (nanoseconds), for example, and that the element can be operated at a low voltage (for example, about 1V) and a low electric current (about 20 μA).

In the variable resistance element 105, there is a possibility that the resistance value obtained in the high resistance state after erasing data may vary greatly, depending on arrangements and manufacturing methods of the insulating film 104 and conductive film 103.

Also, in order to sufficiently erase data without causing errors, a high voltage should be applied to the variable resistance element 105, or a voltage should be applied to the variable resistance element 105 for a long time.

However, if a voltage is applied to the variable resistance element 105 in excess, there is then a possibility of causing a dielectric breakdown in the insulating film 104 to break the variable resistance element 105.

It is desirable to provide a method of driving a storage device, the method reducing variations in the resistance values that change the variable resistance element to a high resistance state after erasing data, and with which the erase operations can be carried out stably and sufficiently.

According to an embodiment, there is provided a method of driving a storage device including a variable resistance element, a resistance value of which is changed reversibly between a high resistance state and a low resistance state by applying voltages with different polarities between two electrodes, the storage device including a plurality of memory cells formed of the variable resistance elements. The method of driving the storage device includes a step of applying voltages more than once in combination to the memory cell when the variable resistance element is changed from the low resistance state to the high resistance state.

According to the method of driving the storage device as described above, when the variable resistance element is changed from the low resistance state to the high resistance state, in other words, data erasing operation is carried out, data can be erased sufficiently without dielectric breakdown and without unerased data by applying voltages more than once in combination to the memory cell.

According to the above-mentioned embodiment, data can be erased sufficiently without dielectric breakdown; as a result, the erase operation can be carried out stably.

Therefore, variations in the resistance values in the high resistance state after erasing data can be reduced.

Accordingly, reliability of the storage device can be improved.

Additional features and advantages are described herein, and will be apparent from, the following Detailed Description and the figures.

DETAILED DESCRIPTION

Embodiments will be described below in the further detail with reference to the drawings.

Figure 2A:
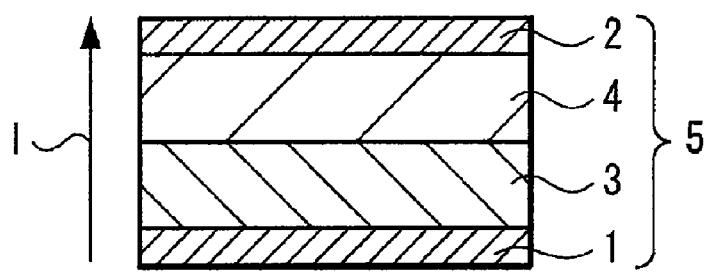
FIG. 2A is a cross-sectional view showing a film arrangement of a variable resistance element constituting a memory element according to an embodiment.

FIG. 2A is a schematic cross-sectional view showing a variable resistance element according to an embodiment.

Figure 1A:
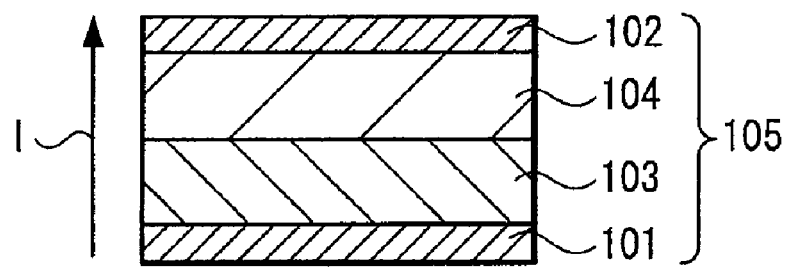
FIG. 1A is a cross-sectional view showing a film arrangement of a non-volatile variable resistance element.
Figure 1B:
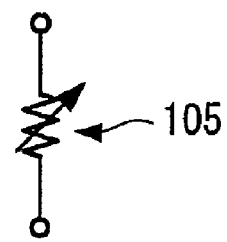
FIG. 1B is a diagram showing a circuit symbol of the non-volatile variable resistance element shown in FIG. 1A.

As shown in FIG. 2A, a variable resistance element 5 has a film arrangement in which a conductive film 3 and an insulating film 4 are provided between two electrodes 1 and 2. In other words, the film arrangement shown in FIG. 2A is similar to that of the variable resistance element 105 shown in FIG. 1A.

Figure 2B:
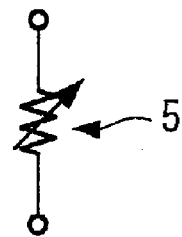
FIG. 2B is a diagram showing a circuit symbol of the variable resistance element shown in FIG. 2A.

Further, FIG. 2B is a diagram showing a circuit symbol of the variable resistance element 5. The direction pointed by an upward arrow in the circuit symbol shown in FIG. 2B corresponds to the upward direction to which an electric current I shown in FIG. 2A is directed.

The conductive film 3 may be made of a metal film, an alloy film (for example, CuTe alloy film), a metal compound film or the like, containing at least one metal element selected from Cu (copper), Ag (silver) and Zn (zinc).

Also, the insulating film 4 may be made of an insulator such as amorphous $Gd_2O_3$, $SiO_2$ and the like.

In the case where the above-mentioned materials are used, Cu, Ag and Zn contained in the conductive film 3 are ionized and attracted to the cathode side. It should be noted that metal elements, which are similarly easy to ionize, other than Cu, Ag and Zn may be used to form the conductive film 3.

Accordingly, when a voltage is applied between the electrodes 1 and 2 such that the electrode 2 on the side facing the insulating film 4 is at low potential, ions of metal elements are attracted to the electrode 2 and enter the insulating film 4. Then, when the ions of the metal elements reach the electrode 2, the electrodes 1 and 2 are conducted to lower a resistance value. Thus, data (information) is written in the variable resistance element 5.

On the other hand, when a voltage is applied between the electrodes 1 and 2 such that the electrode 1 on the side facing the conductive film 3 is at low potential, the metal elements are ionized, attracted to the electrode 1 and returned from the insulating film 4 to the conductive film 3 so that insulation properties between the electrodes 1 and 2 may increase to increase the resistance value. Thus, data (information) is erased from the variable resistance element 5.

The resistance value of the variable resistance element 5 can be changed reversibly between the high resistance state and the low resistance state by repeating the above-mentioned changes.

Practically, the resistance value of the insulating film 4 changes depending on an amount of ions of the metal elements in the insulating film 4, and hence the insulating film 4 can be regarded as a storage layer to store and retain information.

The variable resistance element 5 has, for example, such a film arrangement of a CuTe film having a thickness of 20 nm being formed as the conductive film 3, and an amorphous $Gd_2O_3$ film having a thickness of 5 nm being formed on the conductive film 3 as the insulating film 4.

A memory cell is configured using the variable resistance element 5 and a large number of memory cells can constitute a memory (storage device).

Figure 3:
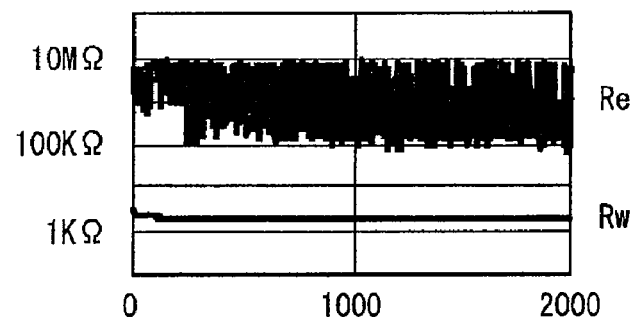
FIG. 3 is a diagram showing an example of characteristics obtained when data was repeatedly rewritten by applying a voltage only one time.
Figure 4:
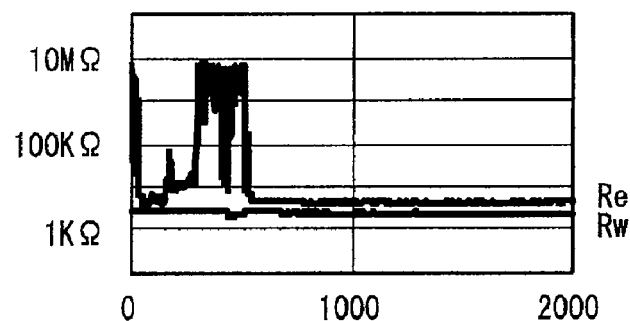
FIG. 4 is a diagram showing another example of characteristics obtained when data was repeatedly rewritten by applying a voltage only one time.

FIGS. 3 and 4 show examples of characteristics obtained in the case where data (information) was repeatedly written in and erased from the variable resistance element 5 having the arrangement shown in FIG. 2A, that is, the variable resistance element 5 was repeatedly rewritten, respectively.

As shown in FIGS. 3 and 4, the horizontal axis represents the number of times of rewriting, and the vertical axis represents the resistance value, where a resistance value (write resistance value) Rw obtained after writing data and a resistance value (erase resistance value) Re obtained after erasing data are plotted, respectively.

The example shown in FIG. 3 illustrates characteristics obtained in the case of repeatedly rewriting data with a voltage of 2.4V applied as a write voltage pulse for 1 μs (microsecond) and a voltage of 1V applied as an erase voltage pulse for 1 μs (microsecond).

As shown in FIG. 3, the resistance value Rw obtained after writing data was relatively stable, but the resistance value Re obtained after erasing data changed considerably at rewriting each time.

Reasons for the change in the resistance value Re obtained after erasing data are assumed as follows.

The erase operation includes two stages: a first stage and a second stage.

In the first stage, the erase voltage is applied to the variable resistance element 5 in the low resistance state, and a relatively large electric current flows to break a conduction path between the electrodes 1 and 2 in the variable resistance element 5.

In the second stage, metal elements ionized after the first stage are caused to move with the action of an electric field and to return to the conductive film 3 from the insulating film 4.

In the first stage, since the variable resistance element 5 is in the low resistance state to allow a relatively large electric current to flow, the voltage effectively applied to the variable resistance element 5 is divided by the fall of potential generated in a wiring resistor and a selection transistor.

On the other hand, in the second stage, since the conduction path has been broken to make the electric current difficult to flow, the voltage effectively applied to the variable resistance element 5 is not divided and a voltage larger than the voltage at the first stage is applied to the variable resistance element 5 as the erase voltage.

Here, if the application of the erase voltage to the variable resistance element 5 at the second stage is insufficient, the ionized metal elements may not completely return to the conductive film 3 from the insulating film 4 to cause unerased data.

When such unerased data remains, the resistance value in the high resistance state obtained after the erasure becomes unstable, and characteristics of retaining the erased state (high resistance state) may deteriorate.

In order to improve such points, data may be erased by applying a high voltage or may be erased by applying a voltage for a long time. However, if such erasing is simply conducted, other disadvantages may occur.

The example shown in FIG. 4 shows the case in which a voltage of 2.5V (higher than the voltage in the example of FIG. 3 by 0.1V) was applied as the write voltage pulse for 1 μs (microsecond) and a voltage higher than that of the example shown in FIG. 3, that is, a voltage of 1.35V was applied as the erase voltage pulse for 10 ns (nanoseconds). A time (pulse width) is shortened by an amount corresponding to the increased voltage.

As shown in FIG. 4, the resistance value Re obtained after erasing data became several kΩ after rewriting data about 500 times repeatedly, and the variable resistance element remained in the low resistance state. The reason is that dielectric breakdown has occurred in the insulating film 4 with application of the voltage of 1.35V.

In the range of rewriting data about 300 to 500 times, the variable resistance element changed to the high resistance state, but the element did not return to the high resistance state completely less than 300 times. Therefore, it is assumed that dielectric breakdown has occurred in the insulating film 4 in the range of rewriting data a fewer number of times.

Accordingly, it is to be understood that unfavorable effects may be caused if data is erased from the insulating film 4 by applying a voltage for a long time (1 μs) as shown in FIG. 3, and if data is erased from the insulating film 4 by applying a high voltage (1.35V) as shown in FIG. 4.

Therefore, erasing may be required to be performed so as not to cause such problems.

A method of driving a storage device according to an embodiment is described. The storage device includes memory cells using the variable resistance elements 5 shown in FIGS. 2A and 2B, and is driven by the method to be changed from the low resistance state to the high resistance state so as to erase data from the storage device.

According to the embodiment, voltage is applied twice to the variable resistance element 5 shown in FIGS. 2A and 2B for erase operation.

At the first application of voltage, a low voltage is applied to the variable resistance element 5 for a relatively long time. At the second application of voltage, a high voltage is applied to the variable resistance element 5 for a relatively short time.

Accordingly, the low voltage is applied for a long time in the first stage of erasing data, and the high voltage is applied for a short time in the second stage of erasing data.

Consequently, dielectric breakdown can be prevented from occurring in the insulating film 4 by applying the low voltage for a long time in the first stage of erasing data.

Further, ionized metal elements can return to the conductive film 3 easily from the insulating film 4 by applying the high voltage for a short time in the second stage of erasing data, and hence an amount of unerased data can be reduced.

Here, as a specific example of the erase voltage pulses applied to the variable resistance element 5 in the embodiment, the low voltage of 1V was applied for a long time (1 μs) at the first application, the high voltage of 1.35V was applied for a short time (10 ns) at the second application, and characteristics obtained in such case were measured similarly to the cases shown in FIGS. 3 and 4. It should be noted that a voltage of 2.5V was applied to the variable resistance element 5 for 1 μs (microsecond) as the write voltage pulse. This example describes a case in which the erase voltage pulse in the example shown in FIG. 3 and the erase voltage pulse in the example shown in FIG. 4 are combined.

Figure 5:
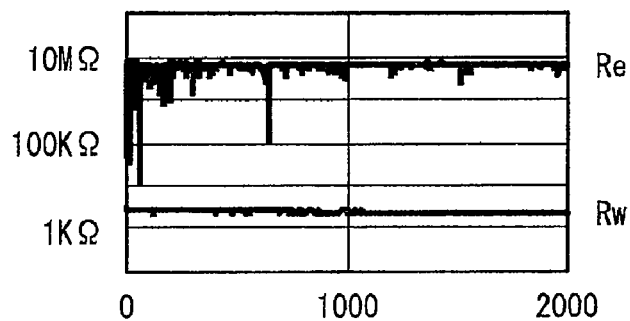
FIG. 5 is a diagram showing characteristics obtained when data is repeatedly rewritten using a driving method according to an embodiment.

Measured results are shown in FIG. 5.

As shown in FIG. 5, the variable resistance element 5 returned to the sufficiently high resistance state after rewriting data repeatedly; unerased data could be reduced; and the erase operation was performed more stably compared to the example shown in FIG. 3.

In the example shown in FIG. 4, since voltage was applied only once, the high voltage of 1.35V was applied in the first stage of erasing data and a large current flowed in the variable resistance element 5, and so Joule heat was generated to make the element be in temperature higher than that in the example shown in FIG. 3.

Then, it is assumed that the variable resistance element 5 entered the second stage remaining in high temperature and the high voltage of 1.35V was further applied, and so dielectric breakdown of the insulating film 4 was accelerated by high temperature.

On the other hand, voltage was applied in two stages in the example shown in FIG. 5, and the voltage of 1V was applied in the first stage of erasing data, which made no difference in temperature rise in the variable resistance element 5 due to the generated Joule heat as compared to the example shown in FIG. 3. Then, after entering the second stage remaining in a state of a small temperature rise in which the conduction path was broken, the high voltage of 1.35V was applied to the variable resistance element 5. Therefore, it is assumed that dielectric breakdown was not caused in the insulating film 4, ionized metal elements could be returned with ease to the conductive film 3 with the application of the high voltage, and so the resistance value obtained after erasing data was stable.

According to the above-mentioned embodiment, voltage is applied twice to the variable resistance element 5 for the erasure operation. Specifically, the low voltage is applied for a relatively long time at the first application, and the high voltage is applied for a relatively short time at the second application. Therefore, since dielectric breakdown can be prevented from occurring in the insulating film 4 and an amount of unerased data can be reduced, the resistance value obtained after erasing data can be stabilized.

Accordingly, reliability can be improved in the storage device including memory cells formed of the variable resistance elements 5.

It should be noted that, if the voltage at the first application is lower than required in the embodiment, there is a possibility that data may not be erased sufficiently.

Accordingly, if the voltage at the first application is selected to be low to a certain extent relative to the voltage at the second application, then dielectric breakdown can be prevented from occurring in the insulating film 4. Therefore, the voltage applied the first time is selected such that dielectric breakdown can be prevented and that data can be erased sufficiently.

Figure 6:
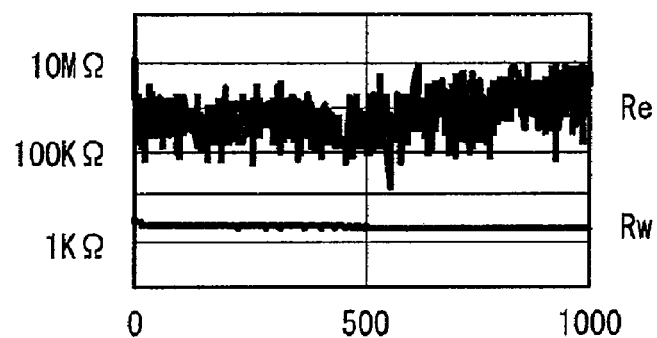
FIG. 6 is a diagram showing further another example of characteristics obtained when data was repeatedly rewritten by applying a voltage only one time.

Next, FIG. 6 shows another example of characteristics obtained when data (information) was repeatedly written in and erased from the variable resistance element 5 having the arrangement shown in FIG. 2A.

FIG. 6 shows the example of characteristics obtained in the case of repeatedly rewriting data with a voltage of 2.5V applied for 100 ns (nanoseconds) as the write voltage pulse, and a voltage of 0.8V applied for 100 ms (milliseconds) as the erase voltage pulse. Specifically, in order to prevent dielectric breakdown from occurring in the insulating film 4, the erase voltage is lowered, but the low voltage is applied for a long time.

As shown in FIG. 6, the resistance value obtained after erasing data was not stable similarly to the example shown in FIG. 3.

It is assumed that although a rapid rise in temperature may cause a problem in the first stage of erasing data, a temperature should be increased suitably to some extent; but in this case, the voltage applied to the variable resistance element 5 is low and a rise of temperature is small.

A method for improving the condition of the example illustrated in FIG. 6 will be described as follows.

A method of driving a storage device according to another embodiment is described. The storage device includes memory cells using the variable resistance elements 5 shown in FIGS. 2A and 2B, and is driven by the method so as to erase data from the storage device.

According to the embodiment, voltage is applied twice to the variable resistance element 5 shown in FIGS. 2A and 2B for erase operation, in which a high voltage is applied for a relatively short time at the first application and a low voltage is applied for a relatively long time at the second application.

Accordingly, in the first stage of the erase operation, the high voltage is applied for a short time. In the second stage of erase operation, the low voltage is applied for a long time.

Since the high voltage is applied for a short time at the first stage of erase operation, the temperature of the variable resistance element 5 can be increased to a certain extent; and therefore, even if the low voltage is applied at the second stage, ionized metal elements can be returned to the conductive film 3 from the insulating film 4.

Since the low voltage is applied for a long time at the second stage of the erase operation, the ionized metal elements can sufficiently be returned to the conductive film 3 from the insulating film 4, thereby an amount of unerased data being reduced.

Here, as a specific example of the erase voltage pulses applied to the variable resistance element 5 in the embodiment, the voltage of 1V was applied for 100 ns (nanoseconds) at the first application, the voltage of 0.8V was applied for 100 ms (milliseconds) at the second application, and characteristics obtained in such case were measured similarly to the case shown in FIG. 6. It should be noted that a voltage of 2.5V was applied to the variable resistance element 5 for 100 ns (nanoseconds) as the write voltage pulse. This example describes a case in which the erase voltage pulse, a pulse width of which is shorter than that in the example shown in FIG. 3, having the same voltage as that example and the erase voltage pulse in the example shown in FIG. 6 are used in combination.

Figure 7:
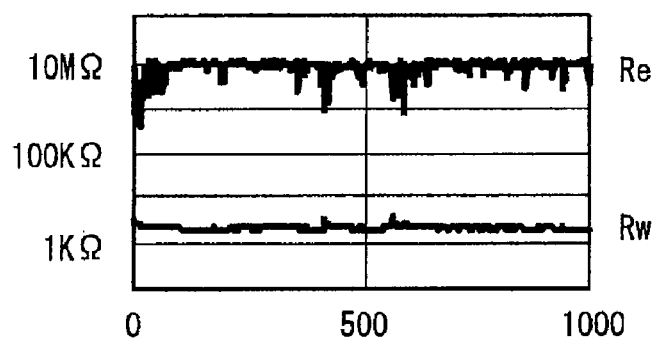
FIG. 7 is a diagram showing characteristics obtained when data is repeatedly rewritten by a driving method according to another embodiment.

Measured results are shown in FIG. 7.

As shown in FIG. 7, the variable resistance element 5 returned to the sufficiently high resistance state after rewriting data repeatedly; unerased data could be decreased; and the erase operation was performed more stably compared to the example shown in FIG. 6.

In the example shown in FIG. 7, it is assumed that ionized metal elements are returned to the conductive film 3 by applying voltage for a long time at the second stage of the erase operation, and so the resistance value obtained after erasing data was stable.

According to the above-mentioned embodiment, voltage is applied twice to the variable resistance element 5 for the erase operation. Specifically, the high voltage is applied for a relatively short time at the first application, and the low voltage is applied for a relatively long time at the second application. Therefore, since dielectric breakdown can be prevented from occurring in the insulating film 4 and an amount of unerased data can be reduced, the resistance value obtained after erasing data can be stabilized.

Accordingly, reliability can be improved in the storage device including memory cells formed of the variable resistance elements 5.

It should be noted that, if the voltage at the first application is higher than required in the embodiment, there is a possibility that dielectric breakdown will be caused in the insulating film 4.

Also, if the voltage at the second application is lower than required, then it may be necessary to apply the voltage for a long time in order to erase data sufficiently. As a result, the operation of the storage device may be slow.

Consequently, if the voltage at the second application is selected to be low to a certain extent relative to the voltage at the first application, then the temperature in the variable resistance element 5 can be increased to facilitate the movement of ions of the metal elements.

Accordingly, the voltages applied the first and second times are selected in consideration of these points.

As shown in the above-mentioned embodiment, variations in erase resistances obtained when data is rewritten repeatedly in the storage device can be decreased by applying voltages to the variable resistance element twice.

With respect to the voltages applied to the variable resistance element, the voltage at the second application may be set to be lower than the voltage at the first application or vice versa.

A method of driving a storage device according to further another embodiment is described. There is described the case in which the voltage at the second application is set to be higher than the voltage at the first application and in which a difference between the voltages at the first application and second application is large.

Here, as a specific example of the erase voltage pulses applied to the variable resistance element 5 in the embodiment, the voltage of 0.2V was applied for 1 μs (microsecond) at the first application, the voltage of 1V was applied for 1 μs (microsecond) at the second application, and characteristics obtained in such case were measured. It should be noted that a voltage of 2.4V was applied to the variable resistance element 5 for 1 μs (microsecond) as the write voltage pulse.

Figure 8:
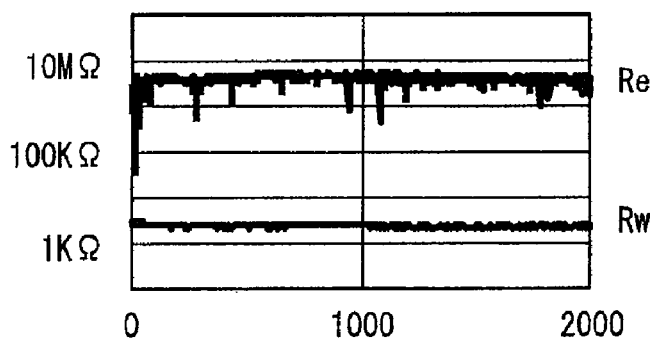
FIG. 8 is a diagram showing characteristics obtained when data is repeatedly rewritten by a driving method according to further another embodiment.

Measured results are shown in FIG. 8.

As shown in FIG. 8, the resistance value obtained after erasing data is more stable than that in the example shown in FIG. 3.

FIG. 8 shows a specific example of this embodiment. This embodiment is similar to the example shown in FIG. 5 in which voltages are applied in two stages, but is different from the example shown in FIG. 5 in operational mechanism.

In the example shown in FIG. 8, since the voltage at the first application is as low as 0.2V and does not reach a sufficient threshold value, the first stage of the erase operation does not take place.

Then, the variable resistance element 5 is pre-heated with Joule heat generated by an electric current flowing when the voltage of 0.2V is applied in the low resistance state. In the state in which the variable resistance element 5 is pre-heated, the first stage of the erase operation and the subsequent second stage of the erase operation take place by applying the second voltage of 1V.

Since the temperature raised by the pre-heat accelerates the operation in the first stage and also accelerates the movement of ions of the metal elements in the second stage, it is assumed that, with the pulse voltage of 1V applied for 1 μs similarly to FIG. 3, ionized metal elements can be sufficiently returned to the conductive film 3 from the insulating film 4, and as a result, the resistance value obtained after erasing data is stable.

If the variable resistance element 5 is pre-heated in excess, then dielectric breakdown in the insulating film 4 also is accelerated. Therefore, the voltages and the pulse widths are selected such that the variable resistance element 5 may be pre-heated properly.

It should be noted that, if the first application of voltage is carried out in order to pre-heat the variable resistance element 5, then the application may be carried out with a voltage having polarity opposite to that of the erase voltage. For example, in the example shown in FIG. 8, instead of the voltage of 0.2V, a voltage of –0.2V, that is, a write voltage of 0.2V may be applied at the first application.

Also, in the case where the voltage is applied at the first application in order to pre-heat the variable resistance element 5, the voltages of the same magnitude may be applied at the first and second applications. In this case, the pulse widths of the voltage pulses may be selected according to need.

Further, it is ideal that the voltages should be applied to the variable resistance element 5 three times by combining the methods according to the above-mentioned embodiments.

In that case, the first application of the voltage is to apply a low voltage in order to pre-heat the variable resistance element 5; the second application thereof is to apply an intermediate voltage so as not to cause dielectric breakdown in the insulating film 4; and the third application thereof is to apply a high voltage in order to return the ionized metal elements to the conductive film 3 in a short time.

The combinations of applied voltages may be properly set in response to the characteristics of the variable resistance element.

The above-mentioned applications of the voltages may be carried out continuously at short intervals or at certain time intervals, and the time interval is not limited.

Preferably, in the case where the degree of the temperature rise is large in the variable resistance element 5 with the first application of the voltage, the voltage at the second application is applied at a long time interval. Conversely, in the case where the degree of the temperature rise is small with the first application of the voltage, the voltage at the second application is applied to the variable resistance element 5 at a short time interval.

While the cases in which the voltage is applied in the form of a pulse voltage (voltage pulse) and the constant voltage is applied for a certain period of time have been described so far in the above-mentioned embodiments and examples, examples are not limited thereto and a voltage may be applied in different modes. For example, a voltage can be changed in accordance with lapse of time. Also, different voltages can be continuously applied more than once without time intervals.

Figure 9:
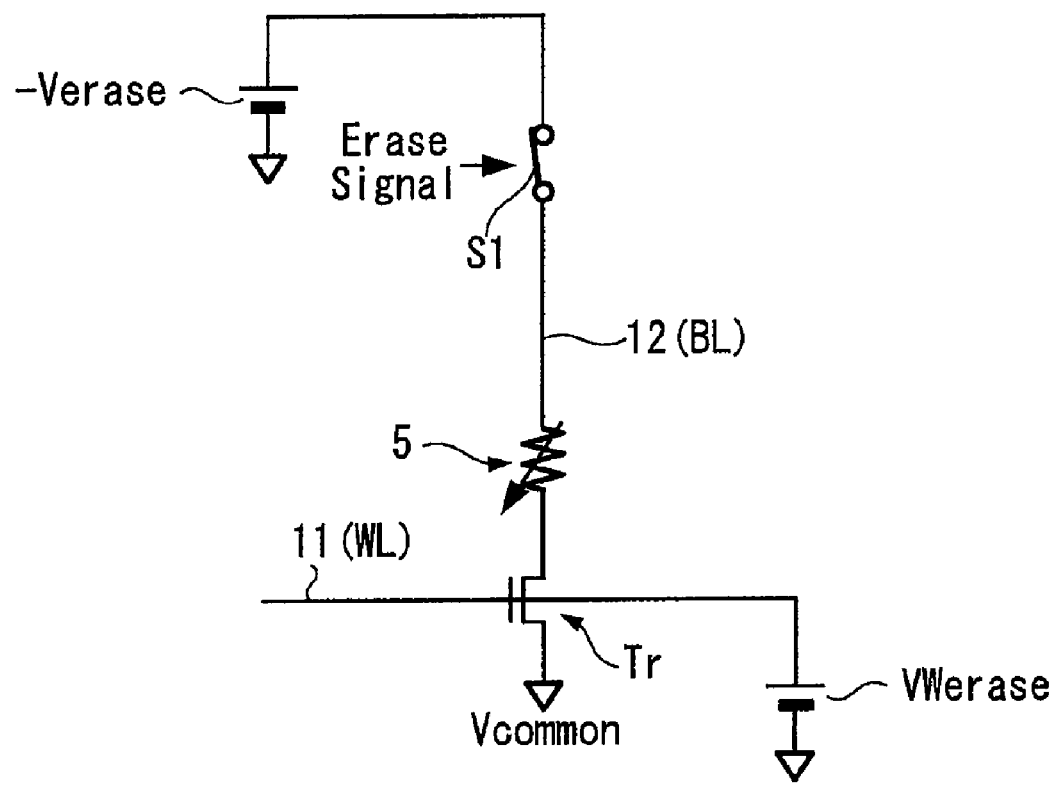
FIG. 9 is a diagram showing an equivalent circuit for a portion related to the erase operation of the storage device according to an embodiment.

FIG. 9 is a diagram showing an equivalent circuit of a circuit arrangement of the storage device, regarding a portion necessary to carry out the above-mentioned erase operation according to embodiments.

As shown in FIG. 9, a bit line 12 (BL) and a selection transistor Tr are connected to the variable resistance element 5 of a selected cell, and a selection word line 11 (WL) is connected to the gate of the selection transistor Tr. A voltage source (not shown) to apply a gate voltage VWerase required to erase data is connected to the selection word line 11 (WL).

A switch S1 is connected to the bit line 12 (BL) on the opposite side to the variable resistance element 5. A power source to apply an erase voltage—Verase is connected to the switch S1.

The switch S1 is connected to the bit line 12 (BL), thereby applying the erase voltage—Verase to the variable resistance element 5 of the selected cell.

In the arrangement of the memory (storage device), the equivalent circuit of which is shown in FIG. 9, the erase voltage can be controlled by controlling the erase voltage—Verase shown in FIG. 9. Alternatively, the erase voltage can be equivalently controlled by controlling the gate voltage VWerase of the selection transistor Tr while the erase voltage—Verase is being fixed.

Further, the erase voltage can also be controlled by combining and executing both of the above-mentioned control operations.

In the arrangement of the memory (storage device), the equivalent circuit of which is shown in FIG. 9, the memory cell is a 1T-1R memory cell in which one non-volatile variable resistance element 5 is connected to one selection transistor Tr. However, not limited thereto, for example, the memory cell according to embodiments may have an arrangement in which a plurality of non-volatile variable resistance elements are connected to one selection transistor and an arrangement in which a selection transistor may not be provided.

Also, the variable resistance element is not limited to the arrangement of the variable resistance element 5 shown in FIGS. 2A and 2B, and other arrangements also can be used.

For example, (1) the order of the conductive film and the insulating film being stacked as shown in FIG. 2A may be reversed so that the conductive film may be stacked on the insulating film; (2) the conductive film may also serve as an electrode as well; (3) instead of providing the conductive film, metal elements used for the conductive film may be contained in the insulating film.

Also, except the variable resistance element including the metal elements which are easy to ionize and the insulating film, various resistance elements having various arrangements can be used.

Embodiments can be applied to variable resistance elements having other arrangements.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of driving a storage device including a variable resistance element in which resistance value is changed reversibly between a high resistance state and a low resistance state by applying voltages with different polarities between two electrodes, the storage device including a plurality of memory cells formed of the variable resistance elements, the method comprising:

applying voltages more than once in combination to the memory cell when the variable resistance element is changed from the low resistance state to the high resistance state.

2. A method of driving a storage device according to claim 1, wherein the voltages are applied twice.

3. A method of driving a storage device according to claim 2, wherein the voltage applied a second time is larger than the voltage applied a first time.

4. A method of driving a storage device according to claim 2, wherein the voltage applied a second time is smaller than the voltage applied a first time.

5. A method of driving a storage device according to claim 2, wherein the voltage applied a first time and the voltage applied a second time have different polarities.

6. A method of driving a storage device according to claim 1, wherein:
   the variable resistance element includes a storage layer formed of an insulator between the two electrodes; and
   a metal element easily ionized is contained in a layer adjoining the storage layer or in the storage layer.

7. A method of driving a storage device according to claim 6, wherein the metal element is selected from the group consisting of Cu, Ag, Zn and combinations thereof.

8. A method of driving a storage device according to claim 2, wherein a pulse width of the voltage applied a first time is shorter than a pulse width of the voltage applied a second time.

9. A method of driving a storage device according to claim 2, wherein a pulse width of the voltage applied a first time is longer than a pulse width of the voltage applied a second time.

* * * * *